(12) United States Patent
Potter, Sr.

(10) Patent No.: US 10,522,380 B2
(45) Date of Patent: Dec. 31, 2019

(54) METHOD AND APPARATUS FOR DETERMINING SUBSTRATE PLACEMENT IN A PROCESS CHAMBER

(71) Applicant: APPLIED MATERIALS, INC., Santa Clara, CA (US)

(72) Inventor: Charles Gregory Potter, Sr., San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1471 days.

(21) Appl. No.: 14/310,560

(22) Filed: Jun. 20, 2014

(65) Prior Publication Data

US 2015/0369583 A1    Dec. 24, 2015

(51) Int. Cl.
    *H01L 21/68*    (2006.01)
(52) U.S. Cl.
    CPC .................... *H01L 21/681* (2013.01)
(58) Field of Classification Search
    None
    See application file for complete search history.

(56) References Cited

U.S. PATENT DOCUMENTS

| | | | |
|---|---|---|---|
| 5,483,138 A * | 1/1996 | Shmookler | H01L 21/681 318/568.16 |
| 6,075,375 A * | 6/2000 | Burkhart | H01L 21/67259 324/662 |
| 6,237,393 B1 | 5/2001 | Ames et al. | |
| 6,313,441 B1 * | 11/2001 | Schaper | F28D 9/04 118/724 |
| 6,377,060 B1 | 4/2002 | Burkhart et al. | |
| 6,441,396 B1 * | 8/2002 | Adams | H01L 21/67288 257/48 |
| 6,471,464 B1 * | 10/2002 | Fay | H01L 21/681 414/783 |
| 6,693,708 B1 * | 2/2004 | Hunter | G01N 21/31 356/237.4 |
| 6,808,590 B1 * | 10/2004 | Gotkis | G01B 7/105 156/345.16 |
| 6,973,370 B2 | 12/2005 | Ito et al. | |
| 7,319,920 B2 | 1/2008 | Donoso et al. | |
| 7,479,236 B2 | 1/2009 | Chen et al. | |
| 7,933,009 B2 | 4/2011 | Serebryanov et al. | |
| 8,060,330 B2 | 11/2011 | O'Neill et al. | |
| 8,600,150 B2 | 12/2013 | Lee et al. | |
| 8,751,047 B2 | 6/2014 | Rodnick et al. | |

(Continued)

*Primary Examiner* — John E Breene
*Assistant Examiner* — Brandon J Becker
(74) *Attorney, Agent, or Firm* — Moser Taboada; Alan Taboada

(57) ABSTRACT

Methods for determining substrate placement in a process chamber are provided herein. In some embodiments, a method for determining substrate placement in a process chamber includes receiving sensor readings from a plurality of sensor arrays attached to the calibration substrate, calculating locations of a plurality of edge locations of a support member beneath the sensors based on the sensor readings, calculating a center point location of the support member based on the locations of the plurality of edge locations of the support member and determining an offset between the center point location and a location of the center of the calibration substrate.

18 Claims, 3 Drawing Sheets

(56) References Cited

U.S. PATENT DOCUMENTS

| | | | |
|---|---|---|---|
| 2004/0060917 A1* | 4/2004 | Liu | F27D 19/00 |
| | | | 219/390 |
| 2005/0262942 A1* | 12/2005 | Samuels | B81B 3/0072 |
| | | | 73/514.01 |
| 2006/0017818 A1* | 1/2006 | Enomoto | G03B 5/00 |
| | | | 348/219.1 |
| 2006/0190916 A1* | 8/2006 | Pike | H01L 21/67242 |
| | | | 716/55 |
| 2007/0019177 A1* | 1/2007 | Wilhelmus Maria Van Buel | G03F 9/7011 |
| | | | 355/55 |
| 2008/0101912 A1* | 5/2008 | Martin | H01L 21/6719 |
| | | | 700/254 |
| 2009/0276075 A1* | 11/2009 | Good | G06Q 10/06 |
| | | | 700/110 |
| 2010/0213603 A1* | 8/2010 | Smeys | H01L 21/4853 |
| | | | 257/698 |
| 2013/0285180 A1* | 10/2013 | Wang | H01L 27/14618 |
| | | | 257/432 |
| 2014/0269822 A1* | 9/2014 | McCloud | G01K 1/143 |
| | | | 374/100 |
| 2016/0306007 A1* | 10/2016 | Liu | G01R 31/2884 |

* cited by examiner

METHOD AND APPARATUS FOR DETERMINING SUBSTRATE PLACEMENT IN A PROCESS CHAMBER

FIELD

Embodiments of the present disclosure generally relate to substrate placement and, more specifically, a method and apparatus for determining substrate placement in a process chamber.

BACKGROUND

In the processing of substrates, such as semiconducting wafers, a substrate is placed on a substrate support in a process chamber. In process chambers, process kits are utilized to prevent undesired deposition on one or more chamber components. The support for the wafer is often a support member such as an electrostatic chuck, to hold the substrate in proper position during the processes performed. Typically, a substrate, or wafer, is placed on the support member by an automated robot. The substrate must generally be centered with the electrostatic chuck in order for the substrate to be processed uniformly, thus the automated robot places the substrate in a rough location initially, and then the location is accurately determined by a few well known methods.

The most common method for substrate placement is to view the substrate under a clear window and adjust placement based on how well the substrate is centered to the process kit surrounding the substrate. However, this method has limited accuracy because the process kit may not be well centered with respect to the support member. Other methods involve relying on etch rate or uniformity of substrates that have already been etched. These methods can be more accurate than the previous method, but can take several hours to get data for adjustment of substrate placement. A third method is to transfer the pattern of the support member onto a substrate either by transferring particles or physically damaging the substrate. While the particle method is accurate, pattern transfer can be unreliable and features on the support member can vary slightly in location, thus resulting in incorrect placement of the substrate.

Accordingly, the inventors have provided embodiments of improved methods and apparatus for determining substrate placement in a process chamber.

SUMMARY

Methods and apparatus for determining substrate placement in a process chamber are provided herein. In some embodiments, a method for determining substrate placement in a process chamber include receiving sensor readings from a plurality of sensor arrays attached to a calibration substrate placed in a rough calibration position on a support member, calculating locations of a plurality of edge locations of the support member beneath the sensors based on the sensor readings, calculating a center point location of the support member based on the locations of the plurality of edge locations of the support member and determining an offset between the center point location and a location of the center of the calibration substrate.

In some embodiments, an apparatus for determining substrate placement in a process chamber includes a placement controller configured to: receive sensor readings from a plurality of sensor arrays embedded in a calibration substrate, the calibration substrate being placed on a support member; calculate locations of a plurality of edge locations of the support member; calculate a center location of the support member; determine an offset between the center location of the support member and a center of the calibration substrate; and transmit a new location for placement of substrates to the support member to a positioning robot.

In some embodiments, an apparatus for determining substrate placement in a process chamber includes: a calibration substrate fabricated with four sensor arrays embedded in the substrate, the four sensor arrays located on a circle approximately near an outer edge of the calibration substrate; and a placement controller. The placement controller is configured to: control a positioning robot to place the calibration substrate on a support member in a process chamber, where the four sensor arrays approximately align with an outer edge of the support member; receive sensor readings from each of the four sensor arrays, and determine that an edge of the support member is found where sensors in each of the sensor arrays change in their reading by a threshold value; calculate four edge locations corresponding to the four sensor arrays and calculating a center location of the support member using the four edge locations; and determine an offset between the center location of the support member and a center location of the calibration substrate, wherein the center location of the calibration substrate is known in reference to reference point within the process chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
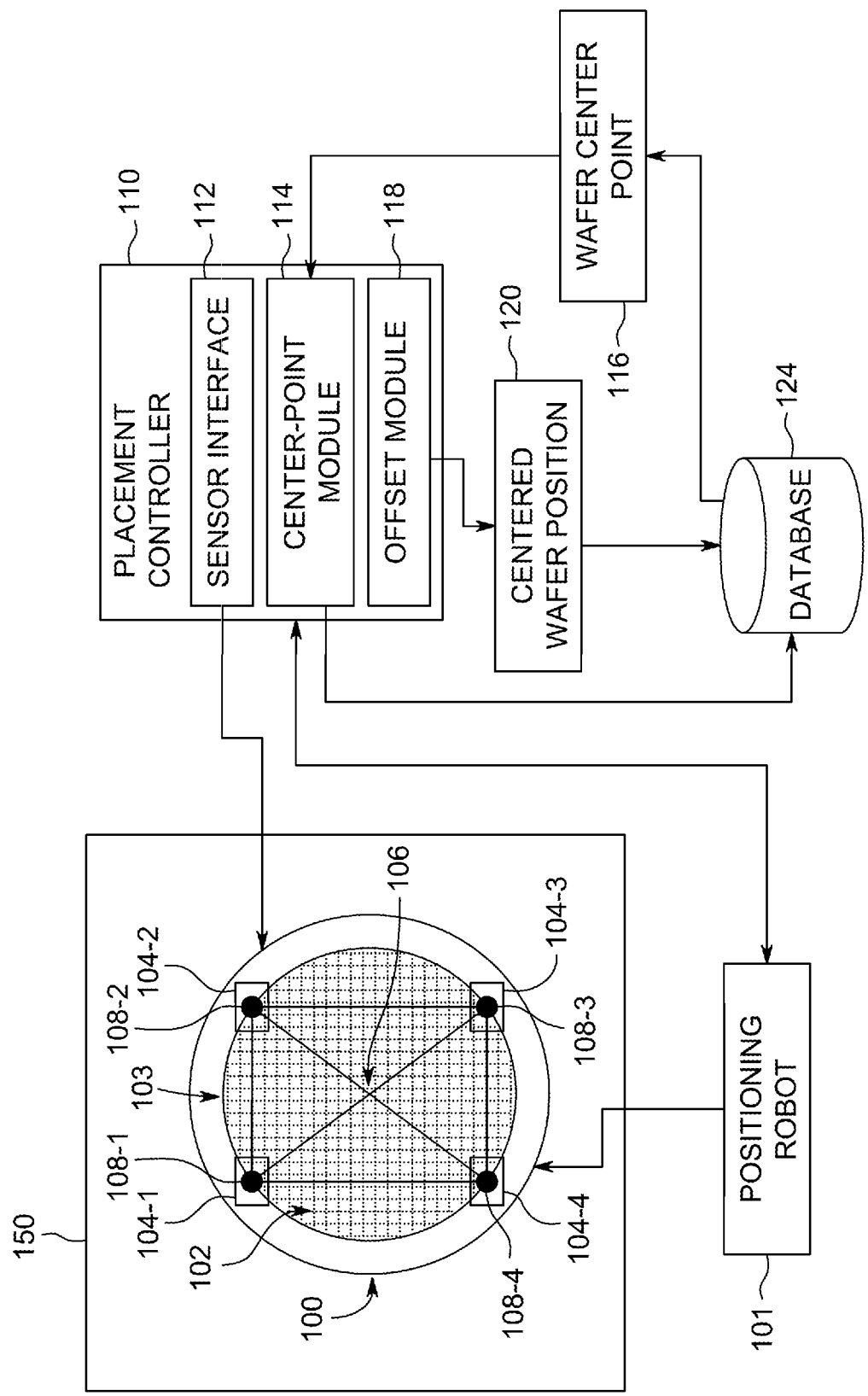
FIG. 1 depicts a block diagram of a calibration substrate and an apparatus for determining substrate placement in a process chamber in accordance with exemplary embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for determining substrate placement in a process chamber are disclosed herein. In some embodiments, a calibration substrate is placed on a support member disposed in a process chamber using a roughly calculated location. Different process chambers may have some small variances in size or positioning of the respective support members disposed therein. Thus, the calibration substrate advantageously include multiple sensing areas which are located roughly where the sensing areas will extend over, or overhang, the support member. The sensors located in each sensing area determine where outer edges of the support member are located to determine the center of the support. The calibration substrate center is compared to the support member center and an offset is calculated. The roughly calculated location of the calibration substrate is then positioned based on the offset for future process substrate to establish an accurate center positioning. The determination of the edge of the support member also enables the method to determine the edge of a process kit, which sits outside the process chamber to aid in uniformity of etching of a wafer.

FIG. 1 depicts a block diagram of a calibration substrate 100 and a placement controller 110 for determining substrate placement on a support member 102 of a process chamber 150 in accordance with exemplary embodiments of the present invention.

The process chamber 150 processes substrates, for example, to create semiconductor devices such as processors, memory devices, transistors, and the like. The calibration substrate 100 is used to determine a location for placement of process substrate on the support member 102 in the process chamber 150. Use of the calibration substrate 100 in accordance with the teachings of the present disclosure may advantageously provide improved, or optimized, substrate placement on a substrate support, thereby enhancing process uniformity.

The calibration substrate 100 comprises a plurality of sensor arrays 104-1 to 104-4. Each of the sensor arrays 104-1 to 104-4 is a cluster of sensors arranged in order to detect an edge of the support member 102 by an examination of the sensor status (e.g., "on" or "off").

The placement controller 110 controls a positioning robot 101 to place the calibration substrate 100 within the process chamber 150 prior to process chamber usage to determine a location, e.g., a more precise location, for substrate placement. In some embodiments, the calibration substrate 100 is placed within the process chamber and controlled via the placement controller 110 during maintenance periods to account for any shifting that may have occurred over time or after removal and replacement of the support member 102. In some embodiments, the placement controller 110 receives sensor readings and determines an offset between the calibration substrate 100 and the support member 102 for future placement of substrates according to a predetermined schedule. The placement controller includes a sensor interface 112, a center point module 114 and an offset module 118, each of which are described further below.

In some embodiments, the plurality of sensor arrays 104-1 to 104-4 may be embedded in the calibration substrate 100. In the embodiment illustrated in FIG. 1, sensor arrays 104-1 to 104-4 (e.g., four sensor arrays) are embedded in the calibration substrate 100, though more may be added for improved accuracy. The calibration substrate 100 comprises an outer portion 103 which extends over the edge of the support member 102. The sensor arrays 104-1 to 104-4 are placed on or near the inner edge of the outer portion 103, so that each of the sensor arrays 104-1 to 104-4 overlap the edge of the support member 102 when the calibration substrate 100 is placed on the support member 102. In some embodiments, the sensor arrays are placed along a circle on or near the inner edge of the outer portion 103, so that each of the sensor arrays overlap the edge of the support member 102 when the calibration substrate 100 is placed on the support member 102.

The sensor interface 112 gathers readings from each of the sensors clustered in each of the sensor arrays 104-1 to 104-4 once the calibration substrate 100 is placed on the support member 102. The readings gathered from the sensor interface 112 indicate, for example, the location of four edge locations 108-1 to 108-4 on an edge of the support member 102. In one embodiment, an edge is deemed, by the placement controller 110, to be the location at which a threshold number of adjacent sensors in the sensor array are in an "on" state. In an embodiment where the sensors transmit non-binary readings such as "on" or "off", the edge is deemed to be where the sensor readings change from one sensor to the next by a preconfigured threshold value. The locations of the edge are determined by the placement controller 110 as the location where the sensor's drop off in readings.

In some embodiments, the locations of the components and their center points are calculated on a two-dimensional plane with an origin defined with respect to the process chamber 150 (for example, a center of the process chamber 150). The location of the sensed four edge locations 108-1 to 108-4 are shared with the center point module 114 to determine the center point 106 of the four edge locations 108-1 to 108-4. The center point 106 correlates to an accurate position for the center point of the support member 102. According to some embodiments, three edge locations are used to determine the center point of the support member 102. In some embodiments, four or more edge locations are used for increased accuracy. The center point module 114 determines location of the center point 106 based on the sensed edge locations using, according to some embodiments, Ptolemy's theorem.

After calculating the location of the center point 106, the center point module 114 retrieves the location of the center point 116 of the calibration substrate 100 from storage in memory, e.g., from the database 124. The center point 116 is known because this is where the calibration substrate was initially placed relative to a predetermined reference point in the process chamber 150. The offset module 118 then calculates the offset between the center point 106 and the center point 116. The offset module 118 determines a new location for the calibration substrate, the centered substrate position 120, and stores the centered substrate position 120 in database 124. Once the process chamber 150 is calibrated this way, the positioning robot 101 will place substrates for processing at the centered substrate position 120, thus being evenly spaced with respect to a process kit disposed on the substrate support during processing, preserving uniformity across the substrate. In some embodiments, the offset is an (x,y) position (e.g., a Cartesian coordinate or the like) and is translated into a position that a positioning robot 101 recognizes, indicating how the positioning robot 101 should modify the placement of the calibration substrate 100 when placing process substrates. According to some embodiments, the offset is translated from an (x,y) position to a kinematic model, specifying to the positioning robot 101, the translation and rotation required to place a process substrate in the correct offset location.

Similarly, the distance between the support member edge and an edge of a process kit surrounding the substrate in the process chamber 150 can be calculated using another set of sensor arrays, positioned at a particular diameter from the center of the calibration substrate 100, using a similar method as described for the support member 102.

The support member 102 may be circular, rectangular, or any shape and size able to support a substrate having given dimensions. A calibration substrate will be particularly fabricated for an individual support member's shape, structure and sensitivities. In an exemplary embodiment, the calibration substrate is made of aluminum or carbon-fiber. However, other materials may be used and the present disclosure does not limit the calibration substrate to aluminum or carbon-fiber. In an exemplary embodiment, the support member may be an electrostatic chuck, a vacuum chuck, a heated or cooled pedestal, a platen, a platform, or the like. For an electrostatic chuck, for example, the sensor arrays 104-1 may be composed of capacitive, optical sensors, or any sensors which can detect the edges of the electrostatic chuck. However, the types of sensor employed by the calibration substrate 100 may differ based on the type of support member 102.

According to some embodiments, each of the sensor arrays 104-1 to 104-4 is comprised of a plurality of sensors which may be capacitive sensors, optical sensors, laser sensors, or any sensors which detect the presence of an object or the absence of an object. In embodiments where capacitive sensors are used, each sensor array comprises pairs of out-of-phase sensors. Typically a grounded target is required for capacitive measurements. By using two probes with an output phase 180 degrees offset from one another, both channels having identical probes spaced away from an ungrounded target with identical gaps and both probes being calibrated for the same range, current injected into the target (e.g., a support member) by probe A will be nulled by an equal and opposite current from probe B. This leaves the ungrounded target at ground potential. Current is also injected from the guard of each probe; this current is not from a constant-current source but is first-order nulled.

By having sensors that are self-grounding there is no need to ground the sensor to the target (e.g., a support member such as an electrostatic chuck) and the measurement can be performed under vacuum conditions.

Figure 2:
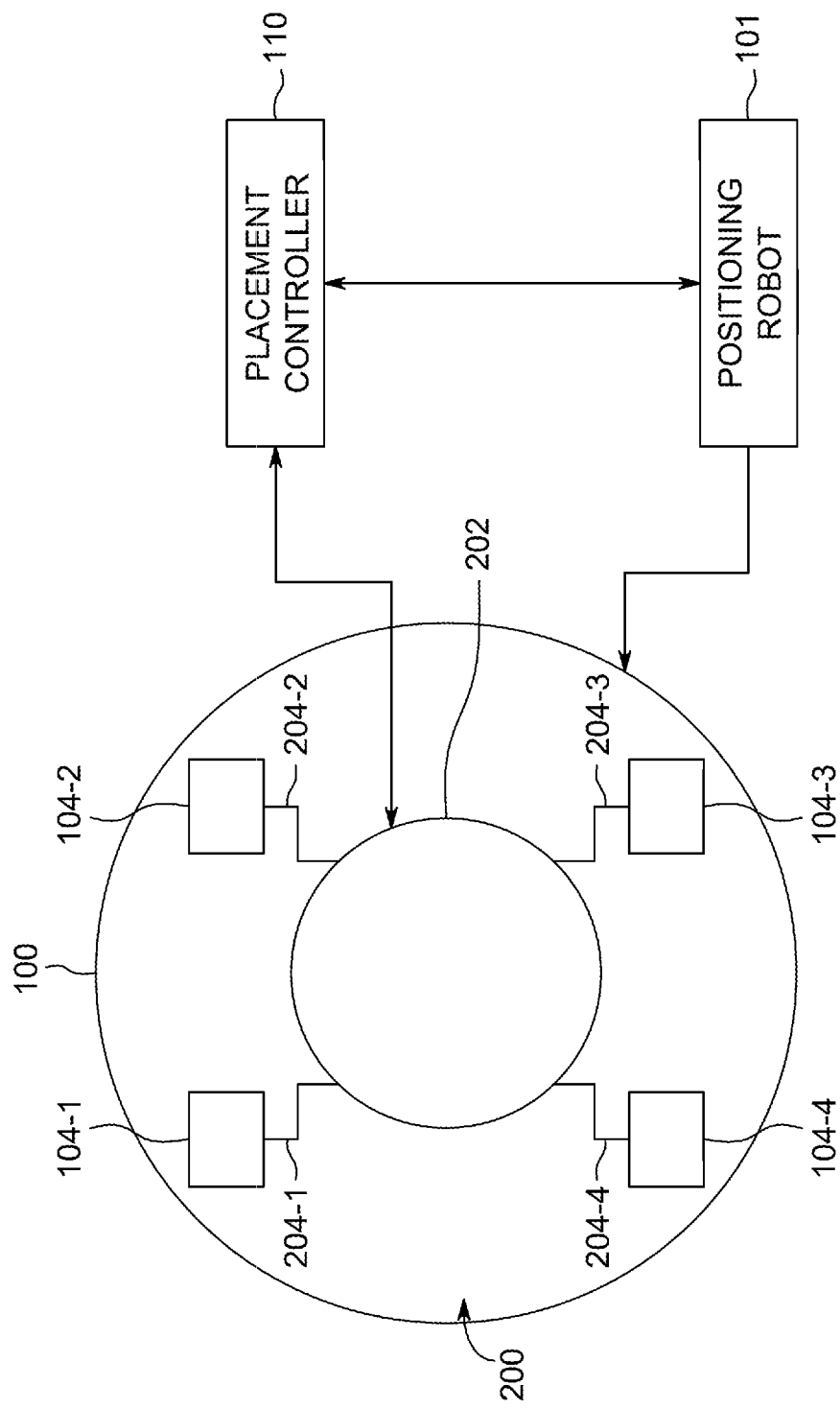
FIG. 2 depicts the bottom portion of the calibration substrate in accordance with exemplary embodiments of the present invention.

FIG. 2 depicts the bottom portion of the calibration substrate 100 in accordance with exemplary embodiments of the present invention. The sensor arrays 104-1 to 104-4 are embedded in the underside of the calibration substrate 100 in order to establish the edges of the support member underneath the substrate. An electronics enclosure 202 is also fabricated as part of the calibration substrate 100 to deliver power and receive readings from the sensors 104-1 to 104-4. In some embodiments, the sensors arrays 104-1 to 104-4 are coupled to the electronics enclosure 202 via respective lines 204-1 to 204-4.

The placement controller 110 reads sensor data from the sensors 104-1 to 104-4 via the electronics enclosure 202 and provides location information to the positioning robot 101. The placement controller 110 controls the positioning robot 101 to place the calibration substrate 100 on a support member in the process chamber 150, where sensors arrays 104-1 to 104-4 approximately align with an outer edge of the 102. The positioning robot 101 positions substrates in an optimal location for maximum uniformity of a processed substrate. The sensor arrays 104-1 to 104-4 may be a uniform array of any type of sensor such as a capacitive sensor, a laser sensor, an optical sensor or the like.

The sensor arrays 104-1 may be positioned in various positions around the calibration substrate 100 in accordance with the structure of the support member 102 (not shown). For example, for a circular support member, three (or four or more) points can be used to determine the center. However, if the support member is rectangular, the sensor arrays 104-1 to 104-4 may be positioned differently to correctly locate the center of the support member.

In some embodiments, the sensors 204-1 may have a wireless connection to the electronics enclosure 202, and the electronics enclosure 202 may be wirelessly coupled to the placement controller 110. The electronics enclosure 202 need not be located at the center of the calibration substrate 100, but may be positioned wherever convenient to the process of fabricating the calibration substrate 100.

Figure 3:
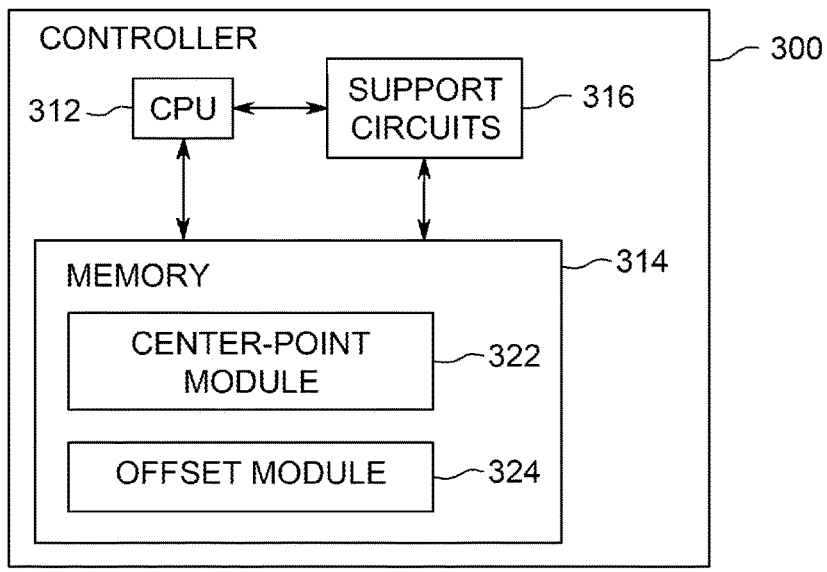
FIG. 3 depicts a block diagram of a controller in accordance with exemplary embodiments of the present invention.

FIG. 3 depicts a block diagram of a controller 300 (e.g., a placement controller) in accordance with exemplary embodiments of the present invention. The controller 300 may be provided and coupled to various components of the process chamber 150 to control the operation thereof. The placement controller 110 of FIG. 1 may be structured as the controller 300. The controller 300 includes a central processing unit (CPU) 312, a memory 314, and support circuits 316. The controller 300 may control the process chamber 150 directly, or via computers (or controllers) associated with particular process chamber and/or support system components. The controller 300 may be one of any form of general-purpose computer processor that can be used in an industrial setting for controlling various chambers and sub-processors. The memory 314, or computer readable medium, of the controller 300 may be one or more of readily available memory such as random access memory (RAM), read only memory (ROM), floppy disk, hard disk, optical storage media (e.g., compact disc or digital video disc), flash drive, or any other form of digital storage, local or remote.

The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 150 and the positioning robot 101 in the manner described herein. The software routine may also be stored and/or executed by a second CPU (not shown) that is remotely located from the hardware being controlled by the CPU 312.

The memory 314 may comprise a sensor interface 320 configured to interact with support circuits 316 to read data using an external I/O interface from the sensor arrays 104-1 to 104-4 embedded in the calibration substrate 100. The memory 314 may further comprise a center point module 322 and an offset module 324. The center point module 322 determines the location of a plurality of edge locations of a support member based on readings from the sensor arrays. The edge locations are then used by the center point module 322 to calculate the center point of the support member. Once the center of the support member is known, the offset module 324 calculates the offset distance by determining the difference between the center point of the support member and the center point of the calibration substrate 100. According to some embodiments, the center of the support member is determined in Cartesian coordinates with the calibration substrate 100 center as the origin (0, 0). The offset of the support member to the origin position is the inverse of the placement error. This offset is typically measured in microns. In some embodiments, the offset is then applied to a kinematic model used by the controller 300 to calculate an adjustment, for example a rotation and extension adjustment for a substrate handling robot, to the placement position of the calibration substrate 100.

Figure 4:
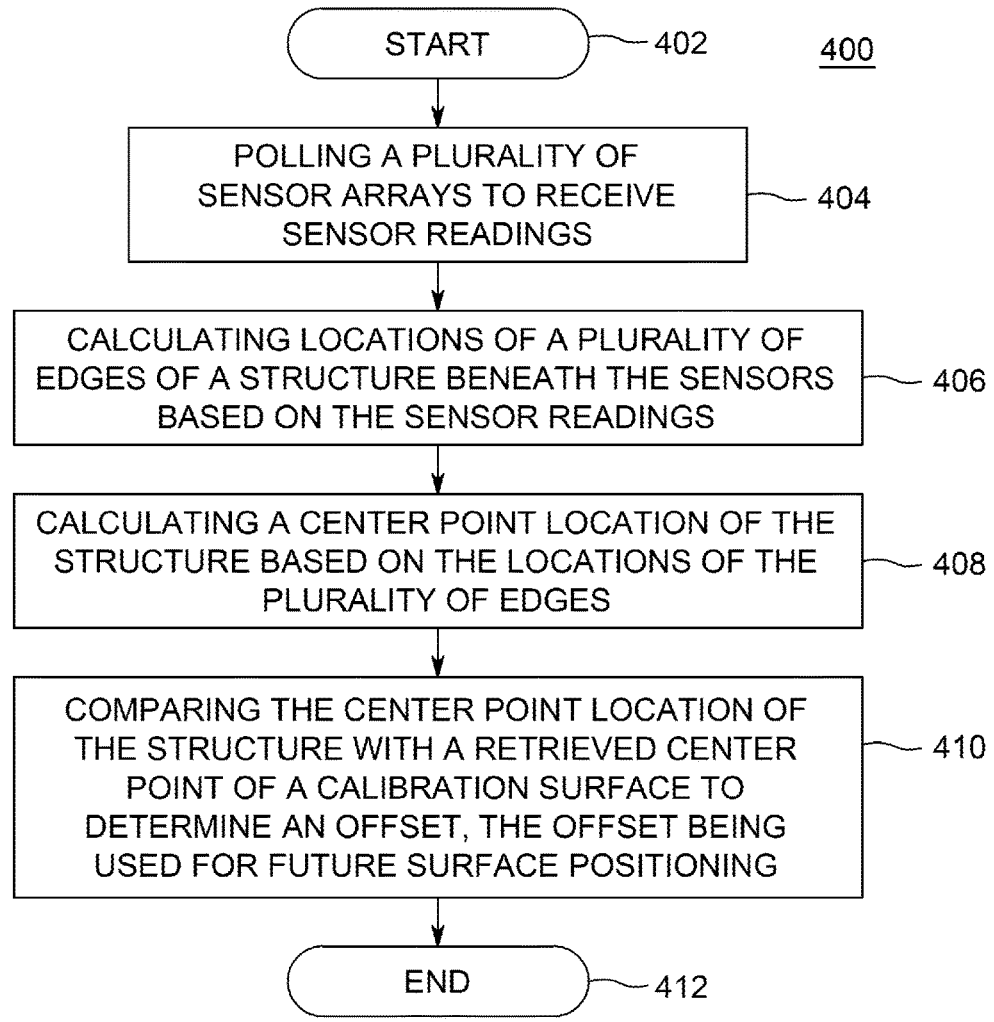
FIG. 4 depicts a flow diagram for a method for determining substrate placement on a support in accordance with exemplary embodiments of the present invention.

FIG. 4 depicts a flow diagram for a method 400 for determining substrate placement on a support member in accordance with exemplary embodiments of the present invention. The method 400 is performed by software stored in memory 314 of the controller 300 depicted in FIG. 3, the software being executed by the CPU 312.

The method 400 begins at 402 and proceeds to 404. At 404 a plurality of sensor arrays on a calibration surface, such as a calibration substrate are polled by the sensor interface 420 to receive sensor readings. The sensor readings indicate which sensors in the sensor array are "on" or "off", indicating a fall off of an under-structure beneath the sensors, e.g., an edge of a support member in a process chamber.

At 406, based on the sensor readings, locations of a plurality of edge locations for the structure beneath the sensors are calculated. In some embodiments, each sensor array establishes one edge location of the structure beneath the sensors in the respective sensor array. In exemplary embodiments, three to four edge locations are established for the structure relative to a predetermined reference point, such as a location of a member of a process chamber or the like.

Once the edge locations are calculated, at 408, the center point module 322 calculates the center point location of the structure beneath the calibration substrate (e.g., the substrate support) based on the calculated edge locations. In some embodiments, Ptolemy's theorem is used to determine the center point of three or four edge locations.

The geometry and the placement location of the calibration substrate is known by the controller 300, thus the center point location of the calibration substrate is calculated by controller 300 and stored in memory 314. At 410, the center point location of the structure is compared with the stored center point location of the calibration substrate. An offset between the center point location of the calibration substrate and the center point location of the structure by the offset module 324 and the offset is stored for accurate positioning of objects above the structure, e.g. positioning process substrates on a support member in a process chamber. The method terminates at 412.

While the foregoing is directed to embodiments of the present disclosure, other and further embodiments of the disclosure may be devised without departing from the basic scope thereof.

The invention claimed is:

1. A method for determining substrate placement in a process chamber comprising:
   receiving sensor readings associated with edge detection of a support member from a plurality of sensor arrays attached to a calibration substrate placed by a positioning robot on the support member, wherein the calibration substrate is fabricated with the sensor arrays;
   calculating locations of a plurality of edge locations of the support member beneath the sensors based on the sensor readings;
   calculating a center point location of the support member based on the locations of the plurality of edge locations of the support member;
   determining an offset between the center point location and a location of the center of the calibration substrate; and
   directing the positioning robot to adjust placement of a subsequent substrate on the support member based on the offset.

2. The method of claim 1, further comprising:
   receiving the sensor readings and determining the offset according to a predetermined schedule.

3. The method of claim 1, wherein the location of the center of the calibration substrate is known relative to a predetermined reference point of the process chamber.

4. The method of claim 1, wherein the support member is an electrostatic chuck, a vacuum chuck, a pedestal, a platen, or a platform.

5. The method of claim 1, wherein at least three edge locations are used to calculate the center point location of the support member.

6. The method of claim 1, further comprising:
   translating the offset from a Cartesian coordinate to a position recognized by a robot placing substrate on the support member.

7. The method of claim 1, further comprising:
   retrieving, from memory, the location of the center of the calibration substrate; and
   storing the offset in the memory.

8. An apparatus for determining substrate placement in a process chamber comprising a placement controller configured to:
   receive sensor readings relating to edge detection of a support member from a plurality of sensor arrays embedded in a calibration substrate, the calibration substrate being placed by a positioning robot on the support member, wherein each sensor within the plurality of sensor arrays is one of an optical sensor, capacitive sensor, or a laser sensor;
   calculate locations of a plurality of edge locations of the support member;
   calculate a center location of the support member;
   determine an offset between the center location of the support member and a center of the calibration substrate;
   transmit a new location for placement of substrates to the support member to a positioning robot; and
   place a subsequent substrate on the support member with the positioning robot based on the new location.

9. The apparatus of claim 8, wherein the placement controller is further configured to receive the sensor readings and determine the offset according to a predetermined schedule.

10. The apparatus of claim 8, wherein the center of the calibration substrate is known relative to a predetermined reference point in the process chamber.

11. The apparatus of claim 8, wherein the support member is an electrostatic chuck, a vacuum chuck, a pedestal, a platen, or a platform.

12. The apparatus of claim 8, wherein at least three edge locations are used to calculate the center location of the support member.

13. The apparatus of claim 8, wherein the placement controller is further configured to translate the offset from a Cartesian coordinate to a position recognized by a robot placing substrates on the support member.

14. The apparatus of claim 13, wherein the offset is translated to a kinematic model.

15. The apparatus of claim 8, wherein the placement controller is further configured to retrieve the location of the center of the calibration substrate and to store the offset in a memory of the placement controller.

16. The apparatus of claim 8, wherein an edge location is deemed to have been detected at a location where a threshold number of adjacent sensors in a sensor array are in an "on" state.

17. An apparatus for determining substrate placement in a process chamber comprising:
   a calibration substrate fabricated with four sensor arrays embedded in the substrate, the four sensor arrays located on a circle approximately near an outer edge of the calibration substrate such that the four sensor arrays provide edge detection information for a support member when the calibration substrate is present on the support member; and a placement controller configured to:
- control a positioning robot to place the calibration substrate on the support member in a process chamber, where the four sensor arrays approximately align with an outer edge of the support member;
- receive sensor readings with edge detection information for the support member from each of the four sensor arrays, and determine that an edge of the support member is found where sensors in each of the sensor arrays change in their reading by a threshold value;
- calculate four edge locations corresponding to the four sensor arrays and calculating a center location of the support member using the four edge locations;
- determine an offset between the center location of the support member and a center location of the calibration substrate, wherein the center location of the calibration substrate is known in reference to reference point within the process chamber; and
- direct the positioning robot to adjust placement of a subsequent substrate on the support member based on the offset.

18. The apparatus of claim 17, wherein the support member is an electrostatic chuck a vacuum chuck, a pedestal, a platen, or a platform.

* * * * *